United States Patent
Kwok

(10) Patent No.: US 10,250,278 B2
(45) Date of Patent: Apr. 2, 2019

(54) COMPRESSION OF A SET OF INTEGERS

(71) Applicant: INTEL CORPORATION, Santa Clara, CA (US)

(72) Inventor: Zion S. Kwok, Vancouver (CA)

(73) Assignee: INTEL CORPORATION, Santa Clara, CA (US)

( * ) Notice: Subject to any disclaimer, the term of this patent is extended or adjusted under 35 U.S.C. 154(b) by 144 days.

(21) Appl. No.: 14/977,292

(22) Filed: Dec. 21, 2015

(65) Prior Publication Data

US 2017/0179977 A1    Jun. 22, 2017

(51) Int. Cl.
*H03M 7/30* (2006.01)

(52) U.S. Cl.
CPC ............... *H03M 7/30* (2013.01); *H03M 7/70* (2013.01)

(58) Field of Classification Search
None
See application file for complete search history.

(56) References Cited

U.S. PATENT DOCUMENTS

| | | | | |
|---|---|---|---|---|
| 9,496,893 B1* | 11/2016 | Strohm, III | ......... | H03M 7/3059 |
| 2006/0215923 A1* | 9/2006 | Beatty | ....................... | G06T 9/00 382/253 |
| 2009/0060047 A1* | 3/2009 | Schneider | ............... | H03M 7/40 375/240.23 |
| 2013/0018932 A1* | 1/2013 | Bhaskar | .............. | H03M 7/3088 708/203 |
| 2015/0188564 A1* | 7/2015 | Dickie | ................ | H03M 7/6005 708/203 |

* cited by examiner

*Primary Examiner* — Michael D. Yaary

(57) ABSTRACT

These present disclosure provides devices and techniques to compress a list of integers. A circuit may include a sorter to sort a list of integers and a subtractor to determine a range of integers represented in the list and to recursively subdivide the range into sub-ranges. The circuit may also include a bit determiner to determine an amount of information (e.g., bits) to use to add indications of the integers in the list to a compresses list information element based on the range and the sub-ranges.

31 Claims, 10 Drawing Sheets

List Information Element 124

| Integer 410-1 | Integer 410-2 | Integer 410-3 | Integer 410-4 | Integer 410-5 | Integer 410-6 | Integer 410-7 | Integer 410-8 |

FIG. 4

Compressed List Information Element 126

| Smallest Integer 510-1 | Largest Integer 510-2 | Indication of middle integer 510-3 | Indication of middle integer 510-4 | Indication of middle integer 510-5 | Indication of middle integer 510-6 | Indication of middle integer 510-7 | Indication of middle integer 510-8 |

Receive a list information element via an input stream, the list information element to include indications of a plurality of integers.
710

Determine a range of the plurality of integers.
720

Generate a compressed list information element and add an indication of the range to the compressed list information element.
730

Recursively determine sub-ranges of the plurality of integers.
740

Add, for each of the sub-ranges, an indication of the sub-ranges to the compressed list information element.
750

FIG. 7

COMPRESSION OF A SET OF INTEGERS

TECHNICAL FIELD

Examples described herein are generally related to compression techniques and more specifically to compressing sets of integers for storage in computer-readable media.

BACKGROUND

Modern computing systems may store lists of data for various purposes. For example, a modern computing system may store a list of integers that represent bad blocks in a computer-readable media, such as, for example, bad blocks of a Solid State Drive (SSD). In some applications, it may be advantageous to compress these lists of integers. Using the SSD example, the SSD controller may maintain the list of bad blocks and store the list to a portion of memory reserved for this purpose. In order to maximize the memory storage efficiency, the list of bad blocks (e.g., represented by integers, or the like) can be compressed before storage.

BRIEF DESCRIPTION OF THE DRAWINGS

FIG. 4 illustrates an example first information element.
FIG. 5 illustrates an example second information element.
FIG. 7 illustrates an example first logic flow.

DETAILED DESCRIPTION

Figure 1:
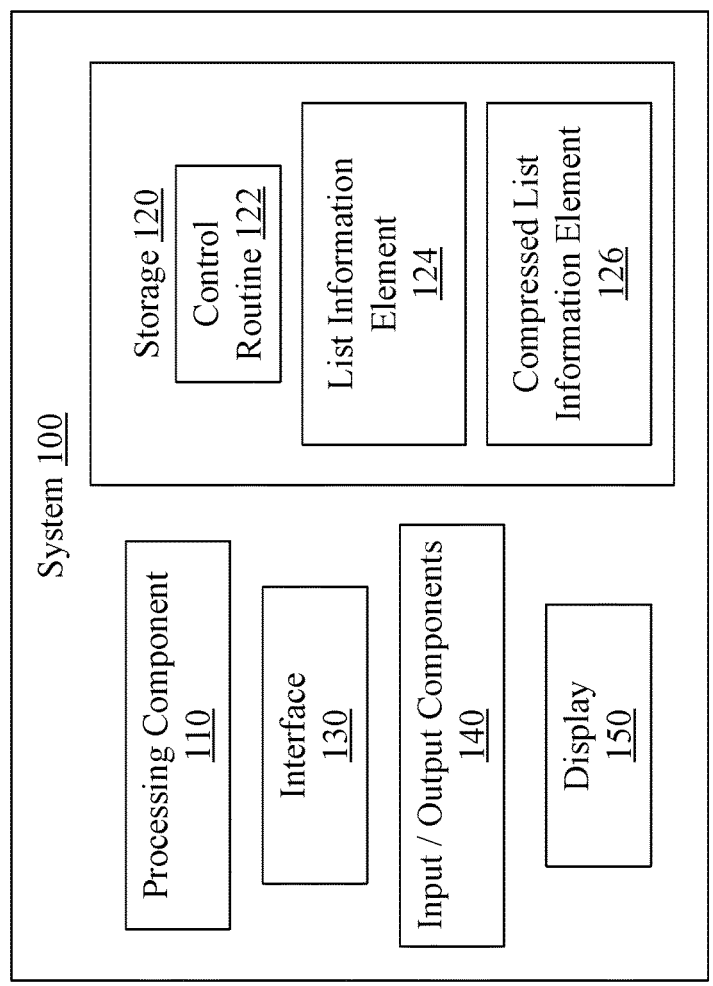
FIG. 1 illustrates an example first system.

As contemplated in the present disclosure, data can be compressed. Data compression refers to the process of reducing the amount of data needed to represent a given information. The underlying basis of the reduction process is the removal of redundant or unnecessary data. Data compression techniques reduce the costs for information storage and transmission and are used in many applications, ranging from simple file size reduction to speech and video encoding.

In particular, the present disclosure may be implemented to compress a set of integers. In some examples, the order of the integers in the set is random. In some examples, the order of the integers in the set does not matter, or the order can be determined from the contents of the set.

In general, an information element including indications of the set of integers is formed. With some examples, the information element comprises an indication of the set of integers using less information (e.g., bits, bytes, or the like) than an information element where the set of integers is indicated explicitly. Accordingly, the information element can be stored to a computer-readable memory storage location and may occupy less space than conventionally storing an information element with indications of the integers in the set. As such, resource usage may be reduced. Said differently, the present disclosure may be implemented to reduce the amount of space (e.g., in bytes, or the like) needed to store a set of integers.

In some examples, the present disclosure determines a range for integers in a set and stores an indication of this range to a compressed list information element. In some examples, the present disclosure defines the range based on a smallest and a largest integer of the set. For example, the present disclosure can sort the integers of the set and store an indication of the range. In some examples, the present disclosure may store an indication of the smallest integer and an indication of the largest integer to indicate the range. The present disclosure may recursively divide the range into sub-ranges by identifying a middle integer of each range or sub-range being divided. As used herein, the term "middle integer" may refer to the integer in the middle position of the range or sub-range being divided. This is explained in greater detail below.

For example, a first sub-range could be determined by identifying a first middle integer and defining the first sub-range based on the smallest integer and the first middle integer. Additionally, a second sub-range can be determined by defining the second sub-range based on the first middle integer and the largest integer. These first and second sub-ranges can themselves be subdivided by storing an indication of middle integers from each sub-range. In some examples, the present disclosure can store an indication of the identified middle integers based on the range or sub-range corresponding to the middle integer. With some examples, an indication of the middle integers may be stored using less information than required to explicitly store an indication of the middle integers. This is described in greater detail below.

Accordingly, the present disclosure provides techniques and apparatuses to determine a range of a set of integers and recursively subdivide the range into sub-ranges while indications of the integers are stored based on the range and/or sub-range to reduce an amount of information necessary to store the set of integers.

It is noted, the present disclosure can be implemented to compress sets of integers representing a variety of information. In particular, the present disclosure can be implemented to compress sets of integers representing, for example, bad blocks in a section of computer-readable memory, telephone numbers, Internet protocol (IP) addresses, license numbers, credit card numbers, passport numbers, hash values, license keys, a dictionary of unique symbols, floating point numbers of a fixed size (e.g., the significant may be represented as an integer, or the like), fixed point numbers of a fixed size, pixel locations, coordinates (e.g., x and y, Global Positioning System (GPS), latitude and longitude, or the like), strings of numbers, file system names, or the like. Examples are not limited to these contexts. Additionally, it is noted, the present disclosure often refers to examples where sets of integers are compressed. This is done for purposes of clarity and convenience only and not to be limiting.

Additionally, the present disclosure provides for retrieving the original set of integers of the compressed set. In general, the techniques to compress the set of integers are reversed to retrieve the original set of integers. More particularly, the position of known integers in the compressed set of integers can be used to determine an unknown integer. That is, the range and/or sub-range of integers can be used to retrieve a middle integer in the range, even where the middle integer is stored in a "compressed" form. This is explained in greater detail below.

Figure 2:
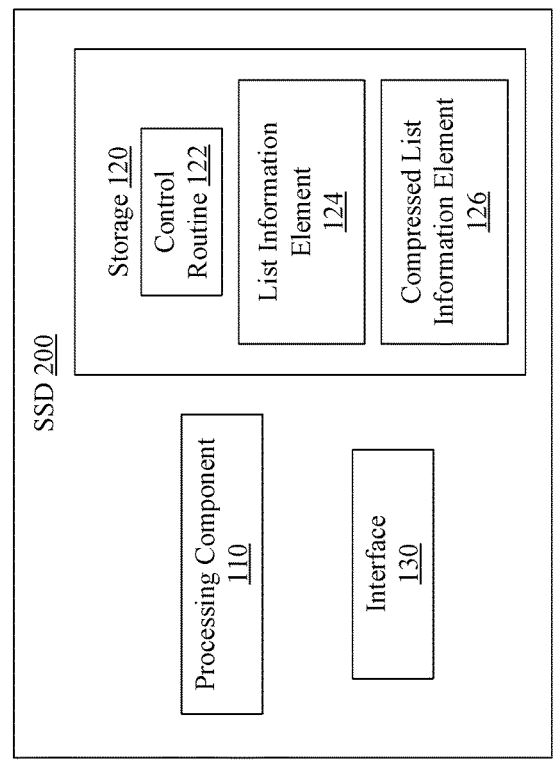
FIG. 2 illustrates an example second system.
Figure 3:
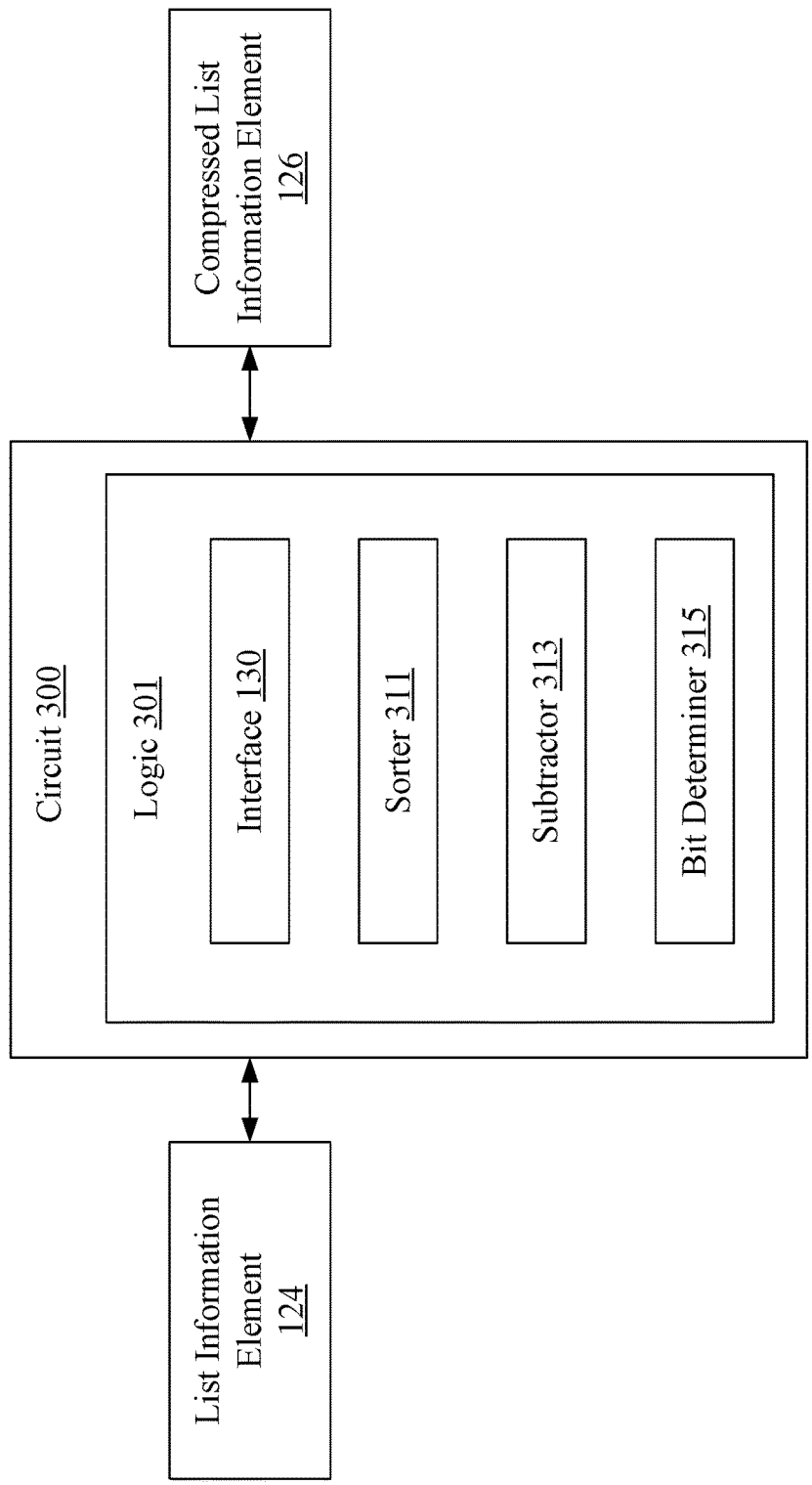
FIG. 3 illustrates an example third system.

FIGS. 1-3 illustrate examples of a system to compress a set of integers, arranged according to at least some implementations of the present disclosure. In particular, FIG. 1 depicts an example system 100, FIG. 2 depicts an example SSD 200, and FIG. 3 depicts an example circuit 300. These figures are described separately from each other for purposes of convenience and clarity. However, it is noted, these figures occasionally use similar numeric designations. This is not to be limiting but is instead done for clarity of presentation.

Turning more specifically to FIG. 1, the system 100 is depicted. The system 100 may be made up, at least in part, of a processing component 110, storage 120, an interface 130, input and/or output components 140, or a display 150. The storage 120 may include control routine 122, a list information element 124, and a compressed list information element 126. The control routine 122 may include programming, logic, and/or features to cause the system 100 to perform various functions. For example, the control routine 122 may include instructions executable by the processing component to implement compression of a set of integers as described herein. Additionally, the control routine 122 may include an operating system or other programming to enable the host system to perform various functions. In some examples, the control routine 122 may be implemented as hardware, such as, for example, transistors, gates, registers, or the like, arranged to implement a particular function.

With some examples, the processing component 110 may include circuitry or processor logic, such as, for example, any of a variety of commercial processors. In some examples, the processing component 110 may include multiple processors, a multi-threaded processor, a multi-core processor (whether the multiple cores coexist on the same or separate dies), and/or a multi-processor architecture of some other variety by which multiple physically separate processors are in some way linked. Additionally, in some examples, the processing component 110 may include graphics processing portions and may include dedicated memory, multiple-threaded processing and/or some other parallel processing capability.

The storage 120 may include logic, a portion of which includes arrays of integrated circuits, forming non-volatile memory to persistently store data or a combination of non-volatile memory and volatile memory. It is to be appreciated, that the storage 120 may be based on any of a variety of technologies. In particular, the arrays of integrated circuits included in storage 120 may be arranged to form one or more types of memory, such as, for example, dynamic random access memory (DRAM), NAND memory, NOR memory, 3-Dimensional cross-point memory, ferroelectric memory, silicon-oxide-nitride-oxide-silicon (SONOS) memory, polymer memory such as ferroelectric polymer memory, ferroelectric transistor random access memory (FeTRAM or FeRAM), nanowire, phase change memory, magnetoresistive random access memory (MRAM), spin transfer torque MRAM (STT-MRAM) memory, or the like.

The system 100 may be operably coupled to another device (not shown) via the interface 130. In general, the interface 130 may include logic and/or features to support a communication interface. For example, the interface 130 may include one or more interfaces that operate according to various communication protocols or standards to communicate over direct or network communication links. Direct communications may occur via use of communication protocols or standards described in one or more industry standards (including progenies and variants) such as those associated with the SMBus specification or the PCI Express specification. Network communications may occur via use of communication protocols or standards such those described in one or more Ethernet standards promulgated by the Institute of Electrical and Electronics Engineers (IEEE). For example, one such Ethernet standard may include Carrier sense Multiple access with Collision Detection (CSMA/CD) Access Method and Physical Layer Specifications, published in December 2012 (hereinafter "IEEE 802.3-2012").

In some examples, the interface may facilitate communication over a bus, such as, for example, peripheral component interconnect express (PCIe), non-volatile memory express (NVMe), universal serial bus (USB), system management bus (SMBus), SAS (e.g., serial attached small computer system interface (SCSI)) interfaces, serial AT attachment (SATA) interfaces, or the like.

In various examples, the input and/or output components 140 may include one or more components to provide input to or to provide output from the system 100. For example, the input and/or output components 140 may be a keyboard, mouse, joystick, microphone, track pad, speaker, haptic feedback device, touchscreen, or the like. In various embodiments, the display 150 may be based on any of a variety of displays (e.g., Plasma, LCD, LED, OLED, or the like) for displaying images and may include touch functionality.

In some examples, the interface 130 can receive the list information element 124, such as, via an input stream. In general, the list information element 126 includes indications of a number of integers (e.g., refer to FIG. 4). It is noted, these integers are often collectively referred to herein as a set of integers, for example, the set of integers to be compressed. The processing component 110 may execute the control routine 122 to generate the compressed list information element 126 from the list information element 124. In particular, the processing component 110, in executing the control routine 122, can generate the compressed list information element 126 including indications of the set of integers indicated in the list information element 122, where the compressed list information element 126 may be smaller (e.g., in bits, or the like) than the list information element 124 (e.g., refer to FIG. 5).

In some examples, the processing component 110, in executing the control routine 122, can determine a range of the set of integers indicated by the list information element 124. In particular, the processing component 110, in executing the control routine 122, can sort the set of integers based at least in part on a value of the integers and can determine a range of the set of integers by determining a smallest integer and a largest integer of the set.

The processing component 110, in executing the control routine 122, can add indications of the range of integers to the compressed list information element 126. For example, the processing component, in executing the control routine 122 can add indications of the smallest integer and the largest integer to the compressed list information element 126. In some examples, the smallest integer and largest integer are represented in the compressed list information element 126 explicitly. In some examples, the smallest integer is indicated in the compressed list information element 126 explicitly while a representation of the largest integer is indicated in the compressed list information element 126. In some examples, the representation of the largest integer is based on the range.

The processing component 110, in executing the control routine 122, can recursively determine a number of subranges of the set of integers. More specifically, the processing component 110, in executing the control routine 122, can subdivide the range into sub-ranges, by for example, determining a middle integer from the range and/or sub-ranges. In general, a middle integer can be determined by identifying the integers in the "middle" position, or the position located between the position of the lower bound and the position of the upper bound of the integers in the range or sub-range being divided. For example, a middle integer for the integers in position (1) and position (5) could be determined by identifying the integer in position (1+5)/2, or the integer in position 3. This is explained in greater detail below.

The processing component 110, in executing the control routine 122, can add an indication of the middle integers to the compressed list information element 126. In some examples, the processing component 110, in executing the control routine 122, can add an indication of a representation of the middle integers. With some examples, the representation of a middle integer is based on the range and/or sub-range of the middle integer. This is explained in greater detail below, for example, with respect to FIGS. 6-8.

In some examples, the processing component 110, in executing the control routine 122, can determine a set of integers (e.g., the list information element 124) from a compressed representation of the set of integers (e.g., the compressed list information element 126). In some examples, the processing component 110, in executing the control routine 122, can select positions in the compressed set of integers with known values. For example, as indicated above, the smallest integer and largest integer can be indicated explicitly in the compressed set of integers.

The processing component 110, in executing the control routine 122, can determine the position of an unknown integer (e.g., a middle integer, or the like) based on the range of these known integers. In particular, the processing component 110, in executing the control routine 122, can determine a number of bits in which the unknown integer is indicated from the range. Additionally, the processing component 110, in executing the control routine 122, can determine a position of the unknown integer in the set of integers and the value of the unknown integer from the range.

The processing component 110, in executing the control routine 122, can subsequently determine sub-ranges of known integers to recursively determine each of the unknown integers in the set of integers (e.g., each of the middle integers, or the like) from the position of the known integers. This is explained in greater detail below, for example, with respect to FIG. 9.

Turning more particularly to FIG. 2, the example SSD 200 is depicted. As noted, many of the same reference numerals are used in FIG. 2 as were used in FIG. 1 for purposes of convenience and clarity. However, this is not intended to be limiting and the SSD of FIG. 2 can be implemented with different components than the system 100 of FIG. 1. The SSD may be made up, at least in part, of the processing component 110, the storage 120, or the interface 130.

The storage 120 can include the control routine 122, the list information element 124, and the compressed list information element 126. In general, the SSD 200 can compress a set of integers as described herein. In particular, the processing component 110, in executing the control routine 122, can generate the compressed list information element 126 from the list information element 124.

Turning more specifically to FIG. 3, circuit 300 is depicted. As noted, many of the same reference numerals are used in FIG. 3 as were used in FIG. 1 for purposes of convenience and clarity. However, this is not intended to be limiting and the circuit 300 of FIG. 3 can be implemented with different components than the system 100 of FIG. 1. The circuit 300 may be made up, at least in part, of logic 301. The logic 301 may include any of a variety of hardware elements, such as, for example, arrays of integrated circuits implemented to perform a particular logical function. The logic can include an interface 130, a sorter 311, a subtractor 313, and a bit determiner 315.

In general, the logic 301 can generate the compressed list information element 126 from the list information element 124. For example, the interface 130 can receive the list information element 124, such as, via an input stream. The sorter 311 can sort the plurality of integers based at least in part on a value of the integers. The subtractor 313 can determine a range and a number of sub-ranges of the plurality of integers, for example, based on determining a difference between the integers. In particular, the subtractor 311 can determine middle integers corresponding to the range and/or sub-ranges. The bit determiner 315 can determine a representation of the integers in the set of integers, for example, based on the range and/or sub-range and can generate the compressed list information element 124 to include a representation of the integers indicated in the list information element 124. Additionally, the interface 130 can output the compressed list information element 126, for example, via an output stream.

In some examples, the logic 301 can generate the list information element 124 from the compressed list information element 126. Said differently, the logic 301 can generate a set of integers from a compressed representation of the set of integers. For example, the interface 130 can receive the compressed list information element 126, such as, via an input stream. The sorter 311 can identify known integers, or integers explicitly indicated in the compressed list.

The subtractor 313 can determine a range and a number of sub-ranges of the plurality of integers, for example, based on determining a difference between the known integers. In particular, the subtractor 313 can determine a position in the set of integers of the middle integers corresponding to the range and/or sub-ranges.

The bit determiner 315 can determine a value of the integers in the set of integers, for example, based on the range and/or sub-range and the position of the middle integers. In particular, the bit determiner 315 can determine a number of bits in which a representation of each middle integer is indicated in the compressed list information element 126 from the range and/or sub-range and can determine a value of the middle integer from the representation of the middle integers.

The interface 130 can output the set of integers as the list information element 124, as a bit stream, or the like.

Any one or more of the system 100, the SSD 200, and/or the circuit 300 can be implemented as part of a host computing platform that may be, for example, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of system 100, the SSD 200 and/or the circuit 300 described herein, may be included or omitted in various embodiments of system 100, the SSD 200, and/or the circuit 300, as suitably desired.

The components and features of system 100, the SSD 200, and/or the circuit 300 may be implemented using any combination of discrete circuitry, application specific integrated circuits (ASICs), logic gates and/or single chip architectures. Further, the features of system 100, the SSD 200, and/or the circuit 300 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example system 100, SSD 200, and circuit 300 shown in the block diagram of FIGS. 1-3 may represent one structurally descriptive example of many potential implementations. Accordingly, division, omission or inclusion of block functions depicted in the accompanying figures does not infer that the hardware components, circuits, software and/or elements for implementing these functions would necessarily be divided, omitted, or included in examples.

FIGS. 4-5 depict examples of the information elements described herein. In particular, FIG. 4 depicts an example of the list information element 124 while FIG. 5 depicts an example of the compressed list information element 126. It is noted, that these information elements may be stored, encoded, and/or formatted according to any of a variety of information standards. For example, the information elements may include various bits arranged to convey information with the element. That is, the information element may be arranged and encoded to convey information in a computing system, such as, for example, the system 100, the SSD 200, and/or the circuit 300. In general, the information elements include a number of indications of information. These indications of information represented in the information element may be stored contiguously and/or non-contiguously in the information element. Examples are not limited in this context.

Turning more particularly to FIG. 4, the list information element 124 is depicted. The list information element 124 includes a number of indications of an integer 410-$a$, where "a" is an integer greater than 1. For example, the list information element 124 is depicted including indications of an integer 410-1, 410-2, 410-3, 410-4, 410-5, 410-6, 410-7, and 410-8. Each of the indications of an integer includes a representation of an integer. In some examples, the indications 410-$a$ include an explicit representation of an integer. For example, the first indication of an integer 410-1 may represent the integer "14". This may be represented in any of a variety of forms, such as, for example, hexadecimal, binary, or the like.

The list information element 124, including indications 410-$a$ represent a set of integers, which may be randomly distributed, whose order does not matter, and/or whose order can be determined from the set itself. For example, for purposes of explanation only, the first indication of an integer 410-1 may represent the integer 14; the second indication of an integer 410-2 may represent the integer 1; the third indication of an integer 410-3 may represent the integer 23; the fourth indication of an integer 410-4 may represent the integer 15; the fifth indication of an integer 410-5 may represent the integer 19; the sixth indication of an integer 410-6 may represent the integer 59; the seventh indication of an integer 410-7 may represent the integer 5; and the eighth indication of an integer 410-8 may represent the integer 44. Said differently, the list information element 124 may include indications of the following set [14, 1, 23, 15, 19, 59, 5, and 44].

The list information element 124 may include an indication of each integer explicitly using m bits. For example, for purposes of explanation only, the list information element 124 can include indications of the integers [14, 1, 23, 15, 19, 59, 5, and 44] using 6 bits to indicate each integer, for a total of 48 bits. For example, the list information element 124 can comprise binary indications [001110 000001 010111 001111 010011 111011 000101 101100] to indicate the set of integers. In some examples, the interface 130 could receive the list information element 124 via a bit stream, such as, the bit stream [001110 000001 010111 001111 010011 111011 000101 101100].

Turning more particularly to FIG. 5, the compressed list information element 126 is depicted. The compressed list information element 126 includes a number of indication of an integer 510-$a$, where "a" is an integer greater than 1. In general, the compressed list information element 126 may include an indication of an integer 510-$a$ for each of the indications of integers 410-$a$ in the list information element 124. For example, the compressed list information element 126 is depicted including indications of a smallest integer 510-1, a largest integer 510-2, and indications of middle integers 510-3, 510-4, 510-5, 510-6, 510-7, and 510-8. Each of the indications of an integer in the compressed list information 124 element may include a representation of one of the integers in the list information element 124 using no greater than m bits. In particular, using the example the list information element 124 given above where each integer is represented using 6 bits, the compressed list information element 124 can represent each of the integers using 6 or less bits. This is described in greater detail below. In particular, the present disclosure describes (e.g., refer to FIG. 6) an example compressed list information element 126 including indications of the example set of integers [14, 1, 23, 15, 19, 59, 5, and 44] discussed above. However, in general, the system 100, SSD 200, and/or circuit 300 can generate the compressed list information element 126 based at least on the following:

Sort the integers indicated in the list information element, for example, from smallest to largest.

Determine a range of the sorted set of integers based at least in part on identifying a smallest integer and a largest integer from the sorted set of integers.

Add an indication of the smallest integer to the compressed list information element.

Determine a representation $R_U$ of the largest integer, where $R_U = U-(L+n-1)$, and where U equals the largest integer, L equals the smallest integer, and n equals the number of integers in the sorted set of integers.

Add an indication of the representation of the largest integer to the compressed list information element using $\log_2[U-(L+n)]$ bits.

Recursively sub-divide the range into sub-ranges by identify a middle integer of the range or sub-ranges.

Determine, for each of the identified middle integers, a representation $R_{MX}$ of the middle integer, where $R_{Mx} = M_x - L_x - N_x + 2$, and where $M_X$ equals the middle integer, $L_X$ equals the smallest integer of the range or sub-range being sub-divided, and $N_X$ equals the number of integers in the range or sub-range being sub-divided.

Add, for each representation of a middle integer, an indication of the representation of the middle integer to the compressed list information element using $\log_2[U_X-(L_X+N_X+2)]$ bits, where $U_X$ equals the largest integer of the range or sub-range being sub-divided.

This is explained in greater detail below, for example, with respect to FIGS. 6-8. However, in general, the processing unit 110, in executing the control routine 122, can sort the set of integers from largest to smallest. In particular, the processing unit 110, in executing the control routine 122, can sort the integers 410-1 as [1, 5, 14, 15, 19, 23, 44, and 59]. The processing unit 110, in executing the control routine 122, can determine a range (e.g., smallest integer, largest integer) of the integers, for example, [1, 59]. The processing unit 110, in executing the control routine can store an indication of the integers 410-*a* in the list information element 124 based in part on the range [1, 59]. For example, the processing unit 110, in executing the control routine 122 can store an indication of the smallest integer 510-1 (e.g., 1, or the like) and an indication of the largest integer 510-2 (e.g., 59, the representation $R_U$, or the like) to the compressed list information element 126. In some examples, an indication of the largest integer can be stored in the compressed list information element 126 using less than m bits (e.g., the number of bits used to store the indication in the list information element 124). This is explained in greater detail below.

The processing unit 110, in executing the control routine 122 can recursively sub-divide the range into sub-ranges. For example, the processing unit 110, in executing the control routine 122, can determine a first middle integer of the integers 410-*a*. Said differently, the processing unit 110, in executing the control routine 110, can identify a middle integer of the range, and generate two sub-ranges based on the range and the middle integer. In general, the middle integer is the integer in the middle position, or the integer in the position between the position of the lower bound integer and the position of the upper bound integer of the range or sub-range being divided. The processing unit 110, in executing the control routine 122 can determine a sub-range defined by the smallest integer and the middle integer and a sub-range defined by the middle integer and the largest integer.

Using the example integer set above, the processing unit 110 can determine a first middle integer as 19 and form two sub-sets of integers having a range of [1, 19] and [19, 59], respectively. In particular, the integer in the middle position between the position of the lower bound integer (e.g., position 1) and the position of the upper bound integer (e.g., position 8) is 4.5, which can be rounded up to identify the integer 19. As another example, the position could be rounded down, where the integer 15 could be identified as the middle integer. However, for purposes of convenience in discussing the present disclosure, it is assumed that the position of the integers is rounded up where needed.

The processing unit 110, can divide the range [1, 59] into sub-ranges [1, 19] and [19, 59]. The processing unit 110, in executing the control routine 122, can store an indication of the first middle integer 510-3 (e.g., 19, $R_{MX}$, or the like) to the compressed list information element 126. In some examples, an indication of the middle integer can be stored in the compressed list information element 126 using less than m bits (e.g., the number of bits used to store the indication in the list information element 124). This is explained in greater detail below.

The processing unit 110, in executing the control routine 122, can continue to recursively sub-divide these sub-ranges by identifying additional middle integers and defining additional sub-ranges based on the additional middle integers. In particular, the processing unit 110, in executing the control routine 122, can determine middle integers from each of the sub-ranges and store an indication of the middle integers to the compressed list information element 126. For example, the processing unit 110 can add indications of middle integers 510-4, 510-5, 510-6, 510-7, 510-8 to the compressed list information element 126. In some examples, the processing unit 110 can continue to determine middle integers and store indications of the middle integers until all integers in the set are represented in the compressed list 126.

Additionally, although described in greater detail below (e.g., refer to FIG. 9,) the system 100, SSD 200, and/or circuit 300 can generate the list information element 124 from the compressed list information element 126 based at least on the following:

Select a position $P_L$ of a first integer in the set of integers with a known value $L_X$.

Select a position $P_U$ of a second integer in the set of integers with known value $U_X$.

Determine a range corresponding to the first and second integers.

Recursively sub-divide the range into sub-ranges by identifying a position of a middle integer of the range or sub-ranges.

Determine, for each middle integer, a number of bits used to indicate a representation $R_{MX}$ of the middle integers with in the compressed list information element using $\log_2[U_X-(L_X+N_X+2)]$ bits, where $N_X=P_U-P_L+1$.

Determine, for each middle integer, the value $M_X$ of the middle integer from the representation $R_{MX}$, where $M_X=R_{MX}+L_X+N_X-2$.

Figure 6:
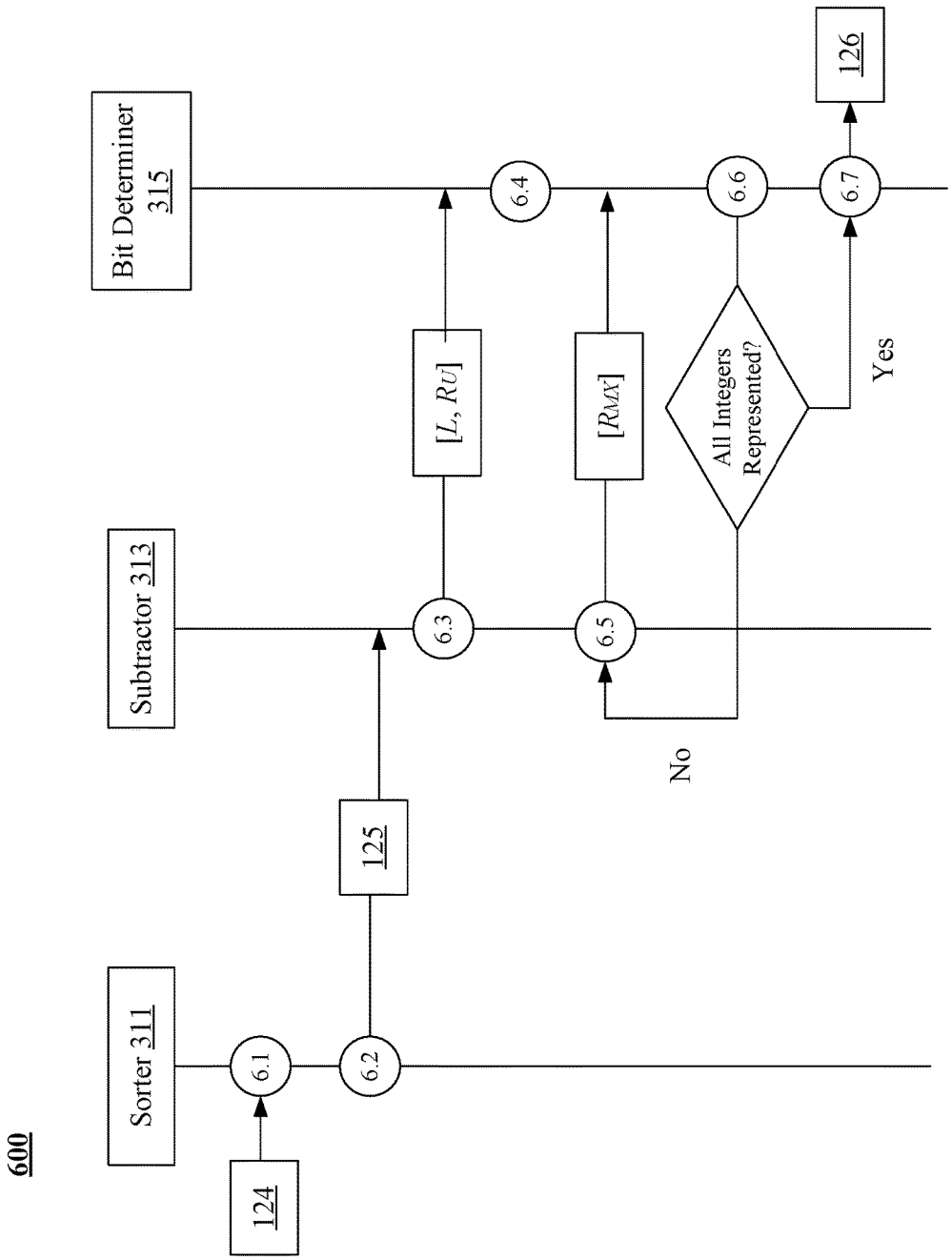
FIG. 6 illustrates an example first technique.

FIG. 6 illustrates a technique 600 to compress a set of integers, according to at least some examples of the present disclosure. The technique 600 is discussed with reference to the circuit 300 of FIG. 3, the list information element 124 of FIG. 4, and the compressed list information element 126 of FIG. 5. Additionally, the technique 600 is discussed with reference to the example set of integers [14, 1, 23, 15, 19, 59, 5, and 44] used above. However, it is noted the technique 600 can be implemented by any of the systems and/or devices discussed herein, such as, for example, the system 100, the SSD 200, the circuit 300, or the like. Furthermore, the technique 600 can be implemented to generate a compressed representation of a set of integers of any size and/or values. Furthermore, binary encoding is used for the indications of integers in this example for purposes of convenience. However, this is not to be limiting and other encoding mechanisms, e.g., hexadecimal, or the like may be implemented. Examples are not limited in these contexts.

It is also worthy to note, the example given here in conjunction with FIG. 6 does not have repeated integers in the set of integers. However, the present disclosure can be implemented to compress a set of integers where integers are repeated in the set. Furthermore, the example given here uses whole numbers in determining the number of bits to use to store an integer or integer representation. However, a fractional number of bits could be used to store an integer or integer representation. For example, an arithmetic encoding scheme could be employed to store indications of integers or integer representation as described herein using fractional numbers of bits. Examples are not limited in these contexts.

The technique 600 may begin at block 6.1. At block 6.1 the sorter 311 can receive the list information element 124. For example, the sorter 311 can receive, via the interface 130, the list information element 124. The list information element 124 can include indications of integers (e.g., 410-*a*, or the like). For example, for purposes of discussion only, the list information element 124 can include indications of n integers [14, 1, 23, 15, 19, 59, 5, and 44], where n equals 8. These n integers may correspond to integer indications 410-1 to 410-8 of the list information element 124.

As can be appreciated, each integer may be represented using m bits. For purposes of explanation, let m equal 6. The variables n and m are referenced below in discussing the determination of compressed representations of each of the integers. In some examples, the sorter 311 can receive the following bit stream [001110 000001 010111 001111 010011 111011 000101 101100] corresponding to the list information element 124. In particular, the sorter 311 can receive this bit stream corresponding to integers 410-1 to 410-8 of the set 124.

Continuing to block 6.2. At block 6.2, the sorter 311 can sort the integers 410-1 to 410-8. For example, the sorter 311 can sort the integers to form a sorted set of integers 125. As a specific example, the sorter 311 can sort the set of integers [14, 1, 23, 15, 19, 59, 5, and 44] as [1, 5, 14, 15, 19, 23, 44, and 59] to generate the sorted set of integers 125 in order from smallest to largest integer.

Continuing to block 6.3. At block 6.3, the subtractor 313 can determine a range of the integers 410-1 to 410-8. For example, the subtractor 313 can identify a lower bound L and an upper bound U for the integers 410-1 to 410-8 from the sorted set 125. In some examples, the subtractor 313 can identify the first integer in the sorted set 125 (e.g., 1, or the like) as the lower bound L and the last integer in the sorted set 125 (e.g., 59, or the like) as the upper bound U. Additionally, the subtractor 313 can determine a compressed representation of the upper bound U based on the range. For example, the subtractor 313 can determine a representation R of the upper bound U based on the following formula, where $R_U$ is the representation of the upper bound.

$$R_U = U - (L + n - 1)$$

For example, the subtractor 313 can determine $R_U$ to be 51 (e.g., 59−(1+8−1)). Where U is the value of the last integer in the set of integers (59), L is the value of the first integer in the set of integers (1), n is the number of integers in the set (8).

Continuing to block 6.4. At block 6.4, the bit determiner 315 can determine a number of bits to store the lower bound L and the representation of the upper bound $R_U$ in the compressed list information element 126. In particular, in some examples, the bit determiner 315 can determine to store an indication of the lower bound and the upper bound using m bits. In some examples, the bit determiner 315 can determine to store an indication of the lower bound L using m bits and an indication of the representation $R_U$ of the upper bound U using $\log_2[U-(L+n)]$ bits, or $\log_2[59-(1+6)]$, which equals 6 bits. For example, given that m equals 6 above, the bit determiner 315 can determine to store indication of the lower bound as [000001] and the upper bound as [110011] in the compressed list information element 126. More specifically, the bit determiner 315 can store [000001] as the indication of the smallest integer 510-1 and [110011] as the indication of the largest integer 510-2.

Continuing to blocks 6.5 and 6.6, which may be repeated recursively. More particularly, at block 6.5 the subtractor 313 can recursively sub-divide the range based on a middle integer $M_X$ and determine a representation $R_{MX}$ of the middle integer, where x is the number of passes through blocks 6.5 and 6.6, or the number of times the range has been divided. In some examples, x equals n minus 2, or in this example 6. At block 6.6, the bit determiner 315 can determine the number of bits to use to store the representation $R_{MX}$ in the compressed list information element 126.

In general, at block 6.5, the subtractor 313 can subdivide the range into one or more sub-ranges. More specifically, the subtractor 313 may identify an integer in the middle position of the range to form sub-ranges defined by the identified middle integer and the range being subdivided. For example, the subtractor 313 can identify middle integer x from position P based on the following formula, where $L_X$ and $U_X$ are the upper and lower bounds of the range being subdivided.

$$P = \frac{P_{LX} + P_{UX}}{2}$$

It is important to note, as the technique recursively subdivides the ranges, the upper and lower bounds of the range (e.g., $L_X$ and $U_X$) may change. More specifically, a number of sub-ranges may be formed by the middle integer and the subdivided range. As such, the position P of the upper and lower bounds (e.g., $P_{LX}$ and $P_{UX}$) may change accordingly. This is explained in greater detail below.

With some examples, at block 6.5, the subtractor 313 determines a representation $R_{MX}$ of the middle integer based on the following formula.

$$R_{MX} = M_X - L_X - N_X + 2,$$

where $$N_X = P_{UX} - P_{LX} + 1$$

With some examples, at block 6.6, the bit determiner 315 determines a number of bits to use to store an indication of the representation $R_{MX}$ of the middle integer based on the following formula.

$$\log_2[U_X - (L_X + N_X + 2)]$$

Continuing with the example set of integers discussed above, the range of integers represented by the list information element 124 can be sub-divided 6 times. More specifically, middle integers $M_1$ to $M_6$ can be recursively identified by continually subdividing the range. Additionally, a representation of these middle integers based on the corresponding upper and lower bounds of the range being subdivided can be determined and stored in the compressed list information element 126. In some examples, blocks 6.5 and 6.6 can be repeated recursively in a depth first search method.

In this example, at a first pass through block 6.5, the subtractor 313 may determine a first middle integer $M_1$, or the integer at position $$P = \frac{P_L + P_U}{2} = \frac{1 + 8}{2} = 5.$$

In particular, the subtractor 313 can identify the integer in the sorted set in position 5. As such, $M_1$ can be identified as the integer 19. Additionally, the subtractor 313 can determine a representation $R_{M1}$ of the first middle integer based on the range. For example, the subtractor 313 can determine $R_{M1} = M_1 - L_1 - (P_U - P_L + 1) + 2 = 19 - 1 - (8 - 1 + 1) + 2 = 12$. In particular, the subtractor 313 can determine the representation $R_{M1}$ equals 12.

At a first pass through block 6.6, the bit determiner 315 can determine a number of bits to store the representation of the first middle integer $R_{M1}$ in the compressed list information element 126. For example, the bit determiner 315 determine to store an indication of the representation of the middle integer $R_{M1}$ using $\log_2[U_1 - L_1 - N_1 + 2] = \log_2[59 - 1 - 9 + 2] = 6$. In particular, the bit determiner 315 can determine to store the representation $R_{M1}$ using 6 bits, or as [001100]. More specifically, the bit determiner can add the indication [001100] as the indication of the first middle integer 510-3 to the compressed list information element 126.

At a second pass through block 6.5, the subtractor 313 can determine a second middle integer $M_2$. In particular, at block 6.5, the subtractor 313 can determine a middle integer between the integers in the range being subdivided. For example, the subtractor 313 may determine a middle integer between the sub-range defined by the lower bound L and the first middle integer $M_1$, or between integers 1 and 19 in the sorted set 125. More specifically, the subtractor 313 can determine the integer at position $$P = \frac{P_L + P_{M1}}{2} = \frac{1+5}{2} = 3 \text{ as } M_2,$$

which is the integer 14. Additionally, the subtractor 313 can determine a representation $R_{M2}$ of the second middle integer based on the range. For example, the subtractor 313 can determine $R_{M2}=M_2-L_2-(P_L-P_{M1}+1)+2=14-1-(5-1+1)+2=10$. In particular, the subtractor 313 can determine the representation $R_{M2}$ equals 10.

At a second pass through block 6.6, the bit determiner 315 can determine a number of bits to store the representation of the second middle integer $R_{M2}$ in the compressed list information element 126. For example, the bit determiner 315 determine to store an indication of the representation of the middle integer $R_{M2}$ using $\log_2[U_2-L_2-N_2+2]=\log_2[19-1-6+2]=4$. In particular, the bit determiner 315 can determine to store the representation $R_{M2}$ using 4 bits, or as [1010]. More specifically, the bit determiner can add the indication [1010] as the indication of the second middle integer 510-4 to the compressed list information element 126.

At a third pass through block 6.5, the subtractor 313 can determine a third middle integer $M_3$. In particular, at block 6.5, the subtractor 313 can determine a middle integer between the integers in the range being subdivided. For example, the subtractor 313 can determine a middle integer between the sub-range defined by the lower bound L and the second middle integer $M_2$, or between integers 1 and 14 in the sorted set 125. More specifically, the subtractor 313 can determine the integer at position $$P = \frac{P_L + P_{M2}}{2} = \frac{1+3}{2} = 2 \text{ as } M_3,$$

which is the integer 5.

Additionally, the subtractor 313 can determine a representation $R_{M3}$ of the third middle integer based on the range. For example, the subtractor 313 can determine $R_{M3}=M_3-L_3-(P_L-P_{M2}+1)+2=5-1-(3-1+1)+2=3$. In particular, the subtractor 313 can determine the representation $R_{M3}$ equals 3.

At a third pass through block 6.6, the bit determiner 315 can determine a number of bits to store the representation of the third middle integer $R_{M3}$ in the compressed list information element 126. For example, the bit determiner 315 determine to store an indication of the representation of the middle integer $R_{M3}$ using $\log_2[U_2-L_2-N_2+2]=\log_2[14-1-3+2]=4$. In particular, the bit determiner 315 can determine to store the representation $R_{M3}$ using 4 bits, or as [0011]. More specifically, the bit determiner can add the indication [0011] as the indication of the third middle integer 510-5 to the compressed list information element 126.

At a fourth pass through block 6.5, the subtractor 313 can determine a fourth middle integer $M_4$. In particular, at block 6.5, the subtractor 313 can determine a middle integer between the integers in the range being subdivided. For example, the subtractor 313 can determine a middle integer between the sub-range defined by the second middle integer $M_2$ and the first middle integer $M_1$, or between integers 14 and 19 in the sorted set 125. More specifically, the subtractor 313 can determine the integer at position $$P = \frac{P_{M2} + P_{M1}}{2} = \frac{3+5}{2} = 4 \text{ as } M_4,$$

which is the integer 15. Additionally, the subtractor 313 can determine a representation $R_{M4}$ of the fourth middle integer based on the range. For example, the subtractor 313 can determine $R_{M4}=M_4-L_4-(P_{M2}-P_{M1}+1)+2=15-14-(5-3+1)+2=0$. In particular, the subtractor 313 can determine the representation $R_{M4}$ equals 0.

At a fourth pass through block 6.6, the bit determiner 315 can determine a number of bits to store the representation of the fourth middle integer $R_{M4}$ in the compressed list information element 126. For example, the bit determiner 315 determine to store an indication of the representation of the middle integer $R_{M4}$ using $\log_2[U_4-L_4-N_4+2]=\log_2[19-14-3+2]=2$. In particular, the bit determiner 315 can determine to store the representation $R_{M4}$ using 2 bits, or as [00]. More specifically, the bit determiner can add the indication [00] as the indication of the fourth middle integer 510-6 to the compressed list information element 126.

At a fifth pass through block 6.5, the subtractor 313 can determine a fifth middle integer $M_5$. In particular, at block 6.5, the subtractor 313 can determine a middle integer between the integers in the range being subdivided. For example, the subtractor 313 can determine a middle integer between the sub-range defined by the first middle integer $M_1$ and the upper bound U, or between integers 19 and 59 in the sorted set 125. More specifically, the subtractor 313 can determine the integer at position $$P = \frac{P_{M1} + P_U}{2} = \frac{5+8}{2} = 6.5 \sim 7 \text{ as } M_5,$$

which is the integer 44. Additionally, the subtractor 313 can determine a representation $R_{M5}$ of the fifth middle integer based on the range. For example, the subtractor 313 can determine $R_{M5}=M_5-L_5-(P_U-P_{UM1}+1)+2=44-19-(8-5+1)+2=23$. In particular, the subtractor 313 can determine the representation $R_{M4}$ equals 23.

At a fifth pass through block 6.6, the bit determiner 315 can determine a number of bits to store the representation of the fifth middle integer $R_{M5}$ in the compressed list information element 126. For example, the bit determiner 315 determine to store an indication of the representation of the middle integer $R_{M5}$ using $\log_2[U_5-L_5-N_5+2]=\log_2[59-19-4+2]=6$. In particular, the bit determiner 315 can determine to store the representation $R_{M5}$ using 6 bits, or as [010111]. More specifically, the bit determiner can add the indication [010111] as the indication of the fifth middle integer 510-7 to the compressed list information element 126.

At a sixth pass through block 6.5, the subtractor 313 can determine a sixth middle integer $M_6$. In particular, at block 6.5, the subtractor 313 can determine a middle integer between the integers in the range being subdivided. For example, the subtractor 313 can determine a middle integer between the sub-range defined by the first middle integer $M_1$ and the fifth middle integer $M_5$, or between integers 19 and 44 in the sorted set 125. More specifically, the subtractor 313 can determine the integer at position $$P = \frac{P_{M1} + P_{M5}}{2} = \frac{5+7}{2} = 6 \text{ as } M_6,$$

which is the integer 23. Additionally, the subtractor 313 can determine a representation $R_{M6}$ of the sixth middle integer based on the range. For example, the subtractor 313 can determine $R_{M6}=M_6-L_6-(P_{M5}-P_{M1}+1)+2=23-19-(7-5+1)+2=3$. In particular, the subtractor 313 can determine the representation $R_{M5}$ equals 3.

At a sixth pass through block 6.6, the bit determiner 315 can determine a number of bits to store the representation of the sixth middle integer $R_{M6}$ in the compressed list information element 126. For example, the bit determiner 315 determine to store an indication of the representation of the middle integer $R_{M6}$ using $\log_2[U_6-L_6-N_6+2]=\log_2[44-19-3+2]=5$. In particular, the bit determiner 315 can determine to store the representation $R_{M6}$ using 5 bits, or as [00011]. More specifically, the bit determiner can add the indication [00011] as the indication of the fifth middle integer 510-7 to the compressed list information element 126.

Continuing to block 6.7. At block 6.7, the bit determiner may output the compressed list information element 126, including compressed indications of the integers in the list information element 124. For example, the bit determiner 315 can output the compressed list information element 126 as the bit stream [000001 110011 001100 1010 0011 00 010111 00011]. It is noted, that this bit stream has 39 bits, whereas the bit stream corresponding to the list information element has 48 bits. As such, the compressed list information element 126 has a compression ratio of approximately 1.23.

FIG. 7 illustrates an example of a first logic flow. As shown in this figure, the first logic flow includes a logic flow 700. Logic flow 700 may be representative of some or all of the operations executed by one or more logic, features, or devices described herein, such as the system 100, the SSD 200, or the circuit 300.

In this illustrated example, logic flow 700 at block 710 may receive a list information element via an input stream, the list information element to include indications of a plurality of integers. For example, the processing unit 110, in executing the control routine 122, may receive the list information element 124 (e.g., via the interface 130, or the like).

The logic flow 700 at block 720 may determine a range of the plurality of integers. For example, the processing unit 110, in executing the control routine 122, may determine a range (e.g., lower bound and upper bound [L, U], or the like).

The logic flow 700 at block 730 may generate a compressed list information element and add an indication of the range to the compressed list information element. For example, the processing unit 110, in executing the control routine 122, may generate the compressed list information element 126 and add an indication of the range to the compressed list information element 126. In some examples, the processing unit may add an indication of the lower bound L and an indication of a representation of the upper bound $R_U$ to the compressed list information element. In some examples, the processing unit 110 can add the representation of the upper bound $R_U$ to the compressed list information element 126 using less bits than used to indicate the upper bound in the list information element 124.

The logic flow 700 at block 740 may recursively determine sub-ranges of the plurality of integers. For example, the processing unit 110, in executing the control routine 122, may recursively determine sub-ranges based on the range by identifying a middle integer $M_X$ of the range.

The logic flow 700 at block 750 may add, for each of the sub-ranges, an indication of the sub-ranges to the compressed list information element. For example, the processing unit 110, in executing the control routine 122, may add an indication of a representation $R_{MX}$ the middle integer of each range or sub-range to the compressed list information 126. In some examples, the processing unit 110 can add the representation of the middle integer $R_{MX}$ to the compressed list information element 126 using less bits that used to indicate the middle integer in the list information element 124.

Figure 8:
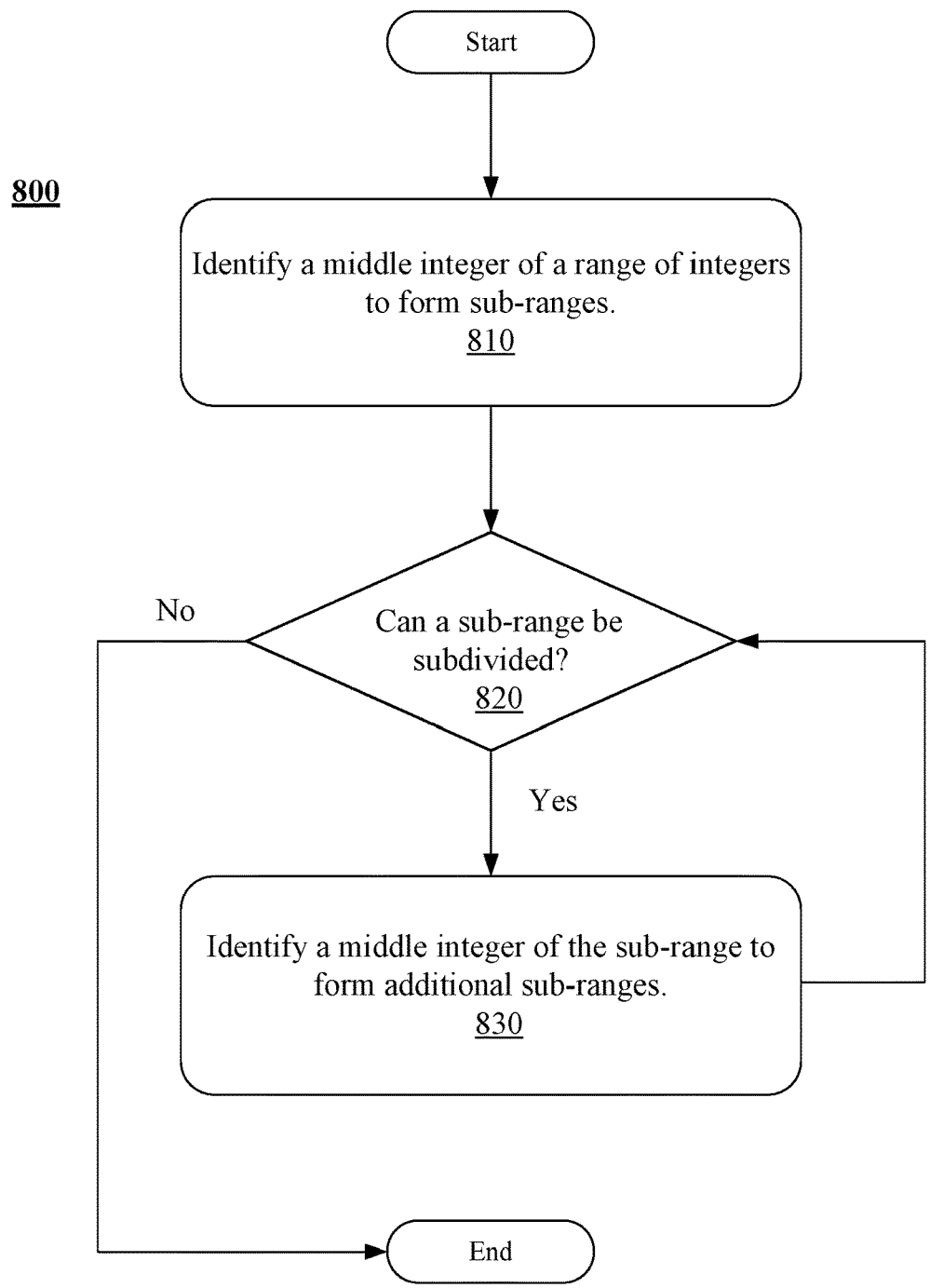
FIG. 8 illustrates an example second logic flow.

FIG. 8 illustrates an example of a second logic flow. As shown in this figure, the second logic flow includes a logic flow 800. Logic flow 800 may be representative of some or all of the operations executed by one or more logic, features, or devices described herein, such as the system 100, the SSD 200, and/or the circuit 300. In some examples, the system 100, the SSD 200, and/or the circuit 300 may implement the logic flow 800 to recursively determine sub-ranges of the plurality of integers (e.g., to implement block 740 of logic flow 700, or the like).

In this illustrated example, logic flow 800 at block 810 may identify a middle integer of a range of integers to form sub-ranges. For example, the processing unit 110, in executing the control routine 122, may identify a middle integer x from position $$P = \frac{P_{LX} + P_{UX}}{2}$$

in the sorted set of integers (e.g., the sorted set 125, or the like), where $P_{LX}$ and $P_{UX}$ are the position of the lower and upper bounds of the range being subdivided, respectively.

The logic flow at decision block 820 may determine whether any of the sub-ranges can be sub-divided. Said differently, logic flow at decision block 820 may determine whether any of the sub-ranges include 3 or more integers. For example, the processing unit 110, in executing the control routine 122, may determine (e.g., using a depth first search methodology, or the like) whether the sub-ranges can be subdivided. For decision block 830, the logic flow 800 may continue to block 830 or may end. In some examples, the logic flow 800 may continue from decision block 820 to block 830 based on a determination that the sub-ranges can be subdivided. In some examples, the logic flow 800 may continue from decision block 820 to end based on a determination that the sub-ranges cannot be subdivided.

The logic flow at block 830 may identify a middle integer of the sub-range to form additional sub-ranges. For example, the processing unit 110, in executing the control routine 122, may identify a middle integer x from position $$P = \frac{P_{LX} + P_{UX}}{2}$$

in the sorted set of integers (e.g., the sorted set 125, or the like), where $P_{LX}$ and $P_{UX}$ are the position of the lower and upper bounds of the sub-range being subdivided, respectively.

Figure 9:
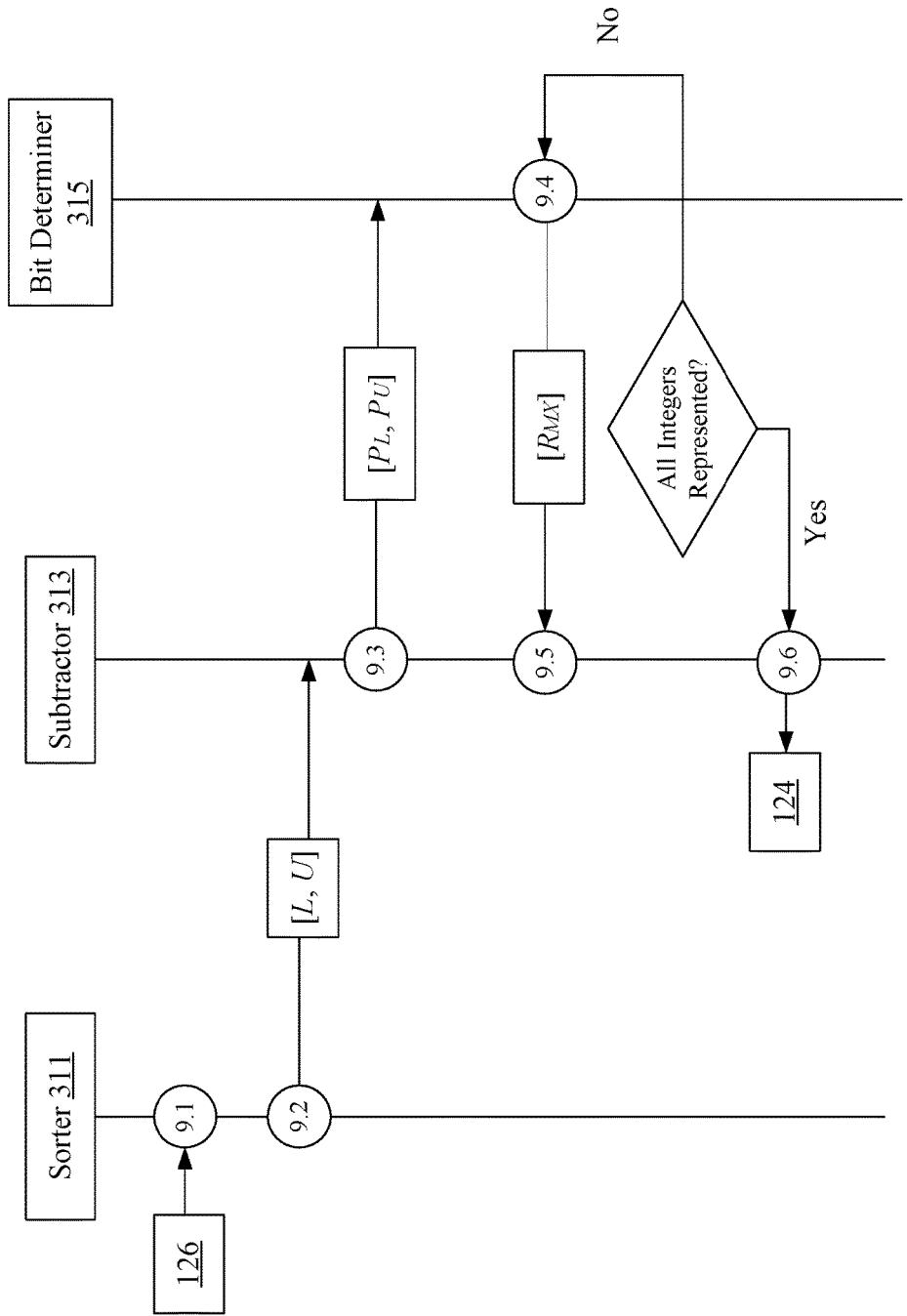
FIG. 9 illustrates an example second technique.

FIG. 9 illustrates a technique 900 to generate a set of integers from a compressed representation of the set of integers, according to at least some examples of the present disclosure. The technique 900 is discussed with reference to the circuit 300 of FIG. 3, the list information element 124 of FIG. 4, and the compressed list information element 126 of FIG. 5. Additionally, the technique 900 is discussed with reference to the example set of integers [14, 1, 23, 15, 19, 59, 5, and 44] used above and the example compressed bit stream [000001 110011 001100 1010 0011 00 010111 00011] representing the example set of integers. However, it is noted the technique 900 can be implemented by any of the systems and/or devices discussed herein, such as, for example, the system 100, the SSD 200, the circuit 300, or the like. Furthermore, the technique 900 can be implemented to generate a set of integers from a compressed representation of the set of integers. Furthermore, binary encoding is used for the indications of integers in this example for purposes of convenience. However, this is not to be limiting and other encoding mechanisms, e.g., hexadecimal, or the like may be implemented. Examples are not limited in these contexts.

The technique 900 may begin at block 9.1. At block 9.1 the sorter 311 can receive the list information element 124. For example, the sorter 311 can receive, via the interface 130, the compressed list information element 126. The compressed list information element 126 can include an indication of a smallest integer (e.g., 510-1, or the like), and indication of a largest integer (e.g., 510-2, or the like) and indications of middle integers (e.g., 510-3 to 510-8, or the like) For example, for purposes of discussion only, the compressed list information element 126 can include indications of n integers, represented as the following bit stream [000001 110011 001100 1010 0011 00 010111 00011], where n equals 8.

Continuing to block 9.2. At block 9.2, the sorter 311 can determine a smallest and a largest integer in the set of integers. For example, the sorter 311 can determine a smallest integer L, from the indication of the smallest integer 510-1 and a largest integer U from the indication of the largest integer 510-2 from the compressed list information element 126. In some examples, the sorter 311 can identify the smallest integer as the first integer indicated in the compressed list information element 126 (e.g., 1, or the like) as the smallest integer is indicated in the list explicitly. In some examples, the sorter 311 can identify the largest integer as the second integer indicated in the compressed list information element 126 (e.g., 59, or the like) as the largest integer is indicated in the list explicitly. In some examples, the sorter 311 can identify the largest integer from a representation R of the upper bound U based on the following formula, where $R_U$ is the representation of the upper bound.

$$U = R_U + (L + n - 1)$$

For example, the sorter 311 can determine the largest integer to be 59 from $R_U$ (e.g., 51+(1+8−1).

Where $R_U$ is the value of the representation of the largest integer in the set of integers (51), L is the value of the first integer in the set of integers (1), n is the number of integers in the set (8).

Continuing to block 9.3, the subtractor 313 can determine a range based on the smallest integer and the largest integer. For example, the subtractor 313 can determine a position $P_L$ of the smallest integer in the set of integers and a position $P_U$ of the largest integer in the set of integers.

Continuing to blocks 9.4 and 9.5, which may be repeated recursively. More particularly, at block 9.4 the bit determiner can recursively determine a number of bits in which a representation $R_{MX}$ of a middle integer $M_X$ in the compressed list information element 126, where x is the number of passes through blocks 9.4 and 9.5, or the number of times a middle integer has been indicated in the compressed list information element 126. At block 9.5, the subtractor 313 can determine the middle integer $M_X$ based on the representation $R_{MX}$ and the range or sub-range to which the middle integer corresponds.

In general, at block 9.4, the bit determiner 315 recursively determine a number of bits in which the representation $R_{MX}$ of the middle integer $M_X$ is indicated, for example, based on the following formula.

$$\log_2[U_X - (L_X + N_X + 2)]$$

The bit determiner 313 can read out this number of bits to retrieve the middle integer representation $R_{MX}$. In particular, continuing with the example set of integers discussed above, representations of 6 middle integers are indicated in the compressed list information element 126. As such, representations of middle integers $R_{M1}$ to $R_{M6}$ can be recursively identified.

In general, at block 6.5, the subtractor 313 can determine the middle integer $M_X$ from the representation $R_{MX}$ and the range. More specifically, the subtractor 313 may identify a middle integer from the representation $R_{MX}$ of the middle integer, for example, based on the following formula.

$$M_x = R_{mx} + L_X + N_X - 2,$$

where $$N_X = P_{Ux} - P_{Lx} +$$

An example of recusivly iterating through block 9.4 and 9.5 are given using the example compressed list information element having the following bit stream [000001 110011 001100 1010 0011 00 010111 00011], corresponding to the following set of integers [1, 5, 14, 15, 19, 23, 44, and 59]. In this example, at a first pass through block 9.4, the bit determiner 315 may determine that the representation of the first middle integer $RM_1$, or the integer at position $$P = \frac{P_L + P_U}{2} = \frac{1 + 8}{2} = 5$$

is indicated in the compressed list information element using $\log_2[U_1 - L_1 - N_1 + 2] = \log_2[59 - 1 - 8 + 2] = 6$ bits. In particular, the bit determiner 315 can determine that the representation $R_{M1}$ is indicated using 6 bits. Additionally, the bit determiner 315 can read out the next 6 bits from the compressed list information element 126, which is [001100], or 12 in decimal.

At a first pass through block 9.5, the subtractor 313 can identify the first middle integer $M_1$ from the representation of the middle integer $R_{M1}$. As such, $M_1$ can be identified as the integer 19. More specifically, the subtractor 313 can identify $M_1$ from the range and the representation, for example, as follows: $M_1 = R_{M1} + L_1 + N_1 - 2 = 12 + 1 + 8 - 2 = 19$. In particular, the subtractor 313 can determine the middle integer $M_1$ equals 19.

At a second pass through block 9.4, the bit determiner 315 may determine that the representation of the second middle integer $R_{M2}$, or the integer at position P=PL+PM12=1+52=3 is indicated in the compressed list information element using $\log_2[U_2 - L_2 - N_2 + 2] = \log_2[19 - 1 - 5 + 2] = 4$ bits. In particular, the bit determiner 315 can determine that the representation $R_{M2}$ is indicated using 4 bits. Additionally, the bit determiner 315 can read out the next 4 bits from the compressed list information element 126, which is [1010], or 10 in decimal.

At a second pass through block 9.5, the subtractor 313 can identify the second middle integer $M_2$ from the representation of the middle integer $R_{M2}$. As such, $M_2$ can be identified as the integer 14. More specifically, the subtractor 313 can identify $M_2$ from the range and the representation, for example, as follows: $M_2=R_{M2}+L_2+N_2-2=10+1+5-2=14$. In particular, the subtractor 313 can determine the middle integer $M_2$ equals 14.

At a third pass through block 9.4, the bit determiner 315 may determine that the representation of the third middle integer $RM_3$, or the integer at position P=PL+PM22=1+32=2 is indicated in the compressed list information element using $\log_2[U_3-L_3-N_3+2]=\log_2[14-1-3+2]=4$ bits. In particular, the bit determiner 315 can determine that the representation $R_{M3}$ is indicated using 4 bits. Additionally, the bit determiner 315 can read out the next 4 bits from the compressed list information element 126, which is [0011], or 3 in decimal.

At a third pass through block 9.5, the subtractor 313 can identify the third middle integer $M_3$ from the representation of the middle integer $R_{M3}$. As such, $M_3$ can be identified as the integer 5. More specifically, the subtractor 313 can identify $M_3$ from the range and the representation, for example, as follows: $M_3=R_{M3}+L_3+N_3-2=3+1+3-2=5$. In particular, the subtractor 313 can determine the middle integer $M_3$ equals 5.

At a fourth pass through block 9.4, the bit determiner 315 may determine that the representation of the fourth middle integer $RM_4$, or the integer at position $$P = \frac{P_{M3} + P_{M1}}{2} = \frac{3+5}{2} = 4$$

is indicated in the compressed list information element using $\log_2[U_4-L_4-N_4+2]=\log_2[19-14-3+2]=2$ bits. In particular, the bit determiner 315 can determine that the representation $R_{M4}$ is indicated using 2 bits. Additionally, the bit determiner 315 can read out the next 2 bits from the compressed list information element 126, which is [00], or 0 in decimal.

At a fourth pass through block 9.5, the subtractor 313 can identify the fourth middle integer $M_4$ from the representation of the middle integer $R_{M4}$. As such, $M_4$ can be identified as the integer 15. More specifically, the subtractor 313 can identify $M_4$ from the range and the representation, for example, as follows: $M_4=R_{M4}+L_4+N_4-2=0+14+3-2=15$. In particular, the subtractor 313 can determine the middle integer $M_4$ equals 15.

At a fifth pass through block 9.4, the bit determiner 315 may determine that the representation of the fifth middle integer $RM_5$, or the integer at position $$P = \frac{P_{M1} + P_U}{2} = \frac{5+8}{2} = 7$$

is indicated in the compressed list information element using $\log_2[U_5-L_5-N_5+2]=\log_2[59-19-4+2]=6$ bits. In particular, the bit determiner 315 can determine that the representation $R_{M5}$ is indicated using 6 bits. Additionally, the bit determiner 315 can read out the next 6 bits from the compressed list information element 126, which is [010111], or 23 in decimal.

At a fifth pass through block 9.5, the subtractor 313 can identify the fifth middle integer $M_5$ from the representation of the middle integer $R_{M5}$. As such, $M_5$ can be identified as the integer 44. More specifically, the subtractor 313 can identify $M_5$ from the range and the representation, for example, as follows: $M_5=R_{M5}+L_5+N_5-2=23+19+4-2=44$. In particular, the subtractor 313 can determine the middle integer $M_5$ equals 44.

At a sixth pass through block 9.4, the bit determiner 315 may determine that the representation of the sixth middle integer $R_{M6}$, or the integer at position P=PM1+PM52=5+72=6 is indicated in the compressed list information element using $\log_2[U_5-L_5-N_5+2]=\log_2[44-19-3+2]=5$ bits. In particular, the bit determiner 315 can determine that the representation $R_{M6}$ is indicated using 5 bits. Additionally, the bit determiner 315 can read out the next 5 bits from the compressed list information element 126, which is [00011], or 3 in decimal.

At a sixth pass through block 9.5, the subtractor 313 can identify the sixth middle integer $M_6$ from the representation of the middle integer $R_{M6}$. As such, $M_6$ can be identified as the integer 23. More specifically, the subtractor 313 can identify $M_6$ from the range and the representation, for example, as follows: $M_6=R_{M6}+L_6+N_6-2=3+19+3-2=23$. In particular, the subtractor 313 can determine the middle integer $M_6$ equals 23.

Figure 10:
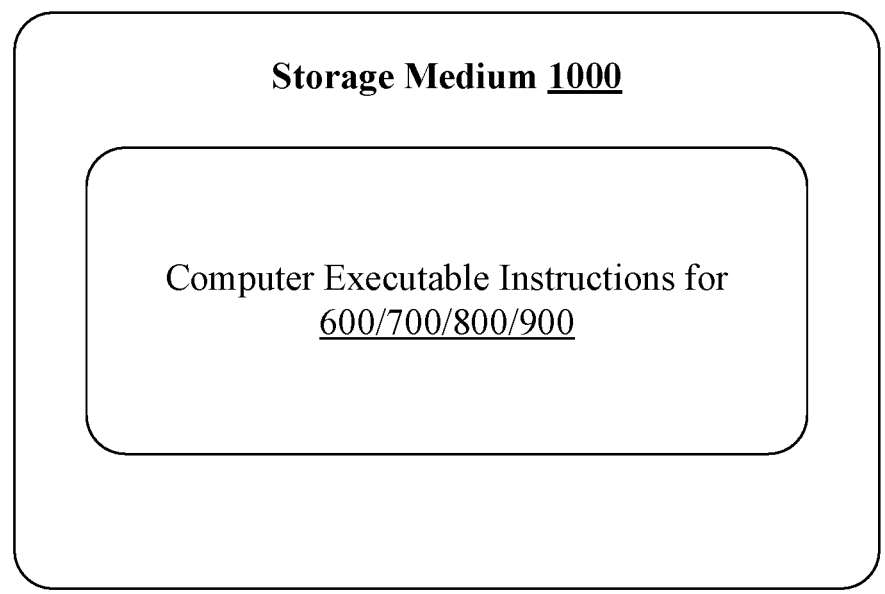
FIG. 10 illustrates an example storage medium.

FIG. 10 illustrates an example of a first storage medium. As shown in this figure, the first storage medium includes a storage medium 1000. The storage medium 1000 may comprise an article of manufacture. In some examples, storage medium 1000 may include any non-transitory computer readable medium or machine readable medium, such as an optical, magnetic or semiconductor storage. In some examples, storage medium 1000 may store various types of computer executable instructions, such as instructions to implement logic flow 600. In some examples, storage medium 1000 may store various types of computer executable instructions, such as instructions to implement logic flow 700. In some examples, storage medium 1000 may store various types of computer executable instructions, such as instructions to implement logic flow 800. In some examples, storage medium 1000 may store various types of computer executable instructions, such as instructions to implement logic flow 900. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 11:
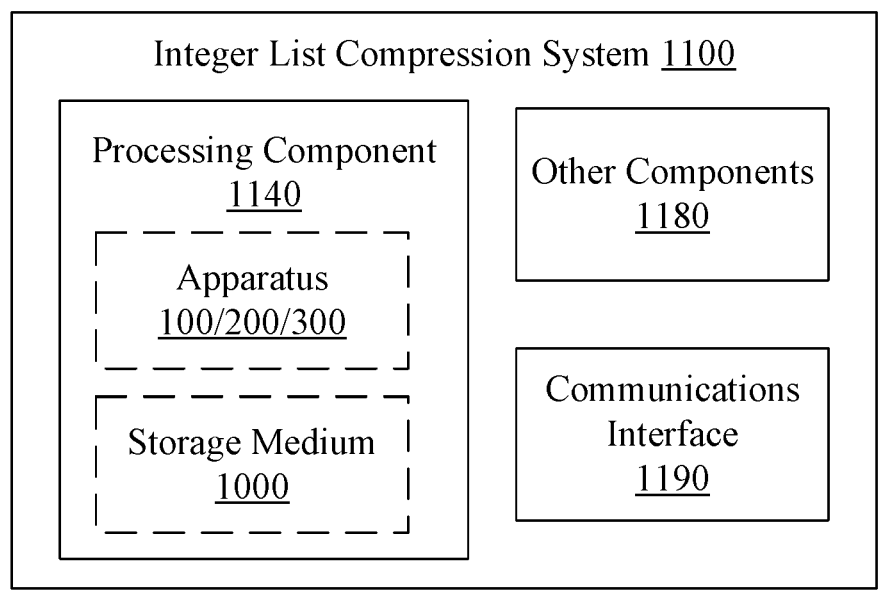
FIG. 11 illustrates an example integer compression system.

FIG. 11 illustrates an example system 1100. In some examples, as shown in this figure, the system 1100 may include a processing component 1110, other components 1180, or a communications interface 1190. According to some examples, system 1100 may be implemented in a device to compress a set of integers.

According to some examples, processing component 1110 may execute processing operations or logic for system 100, SSD 200, circuit 300, and/or storage medium 1000. Processing component 1110 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASICs), programmable logic devices (PLDs), digital signal processors (DSPs), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (APIs), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other components 1180 may include common computing elements or circuitry, such as one or more processors, multi-core processors, co-processors, memory units, interfaces, oscillators, timing devices, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory or any other type of storage media suitable for storing information.

In some examples, communications interface 1190 may include logic and/or features to support a communication interface. For these examples, communications interface 1190 may include one or more communication interfaces that operate according to various communication protocols or standards to communicate over communication links or channels. Communications may occur via use of communication protocols or standards described in one or more industry standards (including progenies and variants) such as those associated with the PCI Express, SATA, SAS (Serial Attached SCSI) standard or specifications.

The components and features of power loss shutdown system 1100 may be implemented using any combination of discrete circuitry, application specific integrated circuits (ASICs), logic gates and/or single chip architectures. Further, the features of power loss shutdown system 1100 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example power loss shutdown system 1100 shown in the block diagram of this figure may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. The following examples of the present disclosure are provided.

EXAMPLE 1

An apparatus comprising: an interface to receive a set of integers; logic, at least a portion of which is implemented in hardware, the logic to: determine a range of the set of integers based on a largest and a smallest integer of in the set of integers; generate a compressed list information element; add an indication of the range to the compressed list information element; recursively subdivide the range into one or more sub-ranges; and add, for each of the one or more sub-ranges, an indication of the one or more sub-ranges to the compressed list information element.

EXAMPLE 2

The apparatus of example 1, comprising a computer-readable storage, the logic to store the compressed list information element to the computer-readable storage.

EXAMPLE 3

The apparatus of example 1, the logic to send a control signal to the interface to cause the interface to output the compressed list information element via an output stream.

EXAMPLE 4

The apparatus of example 1, the logic to sort the set of integers based at least in part on a value of the integers.

EXAMPLE 5

The apparatus of example 4, the logic to: determine the smallest integer of the set of integers; and determine the largest integer of the set of integers.

EXAMPLE 6

The apparatus of example 5, the logic to: add an indication of the smallest integer to the compressed list information element; and add an indication of the largest integer to the compressed list information element.

EXAMPLE 7

The apparatus of example 6, the logic to add an indication of the largest integer to the compressed list information element based at least in part on $R_U = U - (L+n-1)$, where $R_U$ is a representation of the largest integer, U is the largest integer, L is the smallest integer, and n is the number of integers in the range.

EXAMPLE 8

The apparatus of example 6, wherein the indication of the largest integer is added to the compressed list information element using $\log_2[U-(L+n)]$ bits, where U is the largest integer, L is the smallest integer, and n is the number of integers in the range.

EXAMPLE 9

The apparatus of example 6, the logic to: determine a first middle integer of the set of integers based at least in part on the range; determine a first sub-range of the set of integers based at least in part on the smallest integer and the first middle integer; and determine a second sub-range of the set of integers based at least in part on the first middle integer and the largest integer.

EXAMPLE 10

The apparatus of example 9, the logic to: determine a second middle integer of the set of integers based at least in part on either the first sub-range or the second sub-range; and determine a third sub-range of the set of integers based at least in part on the second middle integer and either the smallest integer or the largest integer.

EXAMPLE 11

The apparatus of example 9, the logic to: determine a compressed representation of the first middle integer based at least in part on the smallest integer and the largest integer;

add an indication of the compressed representation of the first middle integer to the compressed list information element.

EXAMPLE 12

The apparatus of example 11, wherein the compressed representation is based at least in part on $R_{Mx}=M_x-L_x-N_x+2$, where $R_{MX}$ is the compressed representation, $M_X$ is the middle integer, Lx is the smallest integer, and $N_X$ is the number of integers in the first sub-range.

EXAMPLE 13

The apparatus of example 12, wherein the indication of the compressed representation is added to the compressed list information element using $\log_2[U_X-(L_X+N_X+2)]$ bits, where $U_X$ is the first middle integer, $L_X$ is the smallest integer, and $N_X$ is the number of integers in the first sub-range.

EXAMPLE 14

A computer-implemented method comprising: receiving a set of integers via an input stream; determining a range of the set of integers based at least in part on a smallest and a largest integer of the set of integers; generating a compressed list information element; adding an indication of the range to the compressed list information element; recursively determining one or more sub-ranges of the set of integers; and adding, for each of the one or more sub-ranges, an indication of the one or more sub-ranges to the compressed list information element.

EXAMPLE 15

The computer-implemented method of example 14, comprising storing the compressed list information element to a memory storage location.

EXAMPLE 16

The computer-implemented method of example 14, comprising outputting the compressed list information element via an output stream.

EXAMPLE 17

The computer-implemented method of example 14, comprising sorting the set of integers based at least in part on a value of the integers.

EXAMPLE 18

The computer-implemented method of example 17, determining the range of the set of integers comprising: determining the smallest integer of the set of integers; and determining the largest integer of the set of integers.

EXAMPLE 19

The computer-implemented method of example 18, adding the indication of the range to the compressed list information element comprising: adding an indication of the smallest integer to the compressed list information element; and adding an indication of the largest integer to the compressed list information element.

EXAMPLE 20

The computer-implemented method of example 19, wherein the indication of the largest integer is based at least in part on $R_U=U-(L+n-1)$, where $R_U$ is a representation of the largest integer, U is the largest integer, L is the smallest integer, and n is the number of integers in the range.

EXAMPLE 21

The computer-implemented method of example 20, wherein the indication of the largest integer is added to the compressed list information element using $\log_2[U-(L+n)]$ bits, where U is the largest integer, L is the smallest integer, and n is the number of integers in the range.

EXAMPLE 22

The computer-implemented method of example 19, recursively determining the one or more sub-ranges of the set of integers comprising: determining a first middle integer of the set of integers based at least in part on the range; determining a first sub-range of the set of integers based at least in part on the smallest integer and the first middle integer; and determining a second sub-range of the set of integers based at least in part on the first middle integer and the largest integer.

EXAMPLE 23

The computer-implemented method of example 22, recursively determining one or more sub-ranges of the set of integers comprising: determining a second middle integer of the set of integers based at least in part on either the first sub-range or the second sub-range; and determining a third sub-range of the set of integers based at least in part on the second middle integer and either the smallest integer or the largest integer.

EXAMPLE 24

The computer-implemented method of example 22, adding an indication of the one or more sub-ranges to the compressed list information element comprising: determining a compressed representation of the first middle integer based at least in part on the smallest integer and the largest integer; and adding the compressed representation of the first middle integer to the compressed list information element.

EXAMPLE 25

The computer-implemented method of example 24, wherein the compressed representation is based at least in part on $R_{Mx}=M_x-L_x-N_x+2$, where $R_{MX}$ is the compressed representation, $M_X$ is the middle integer, $L_X$ is the smallest integer, and $N_X$ is the number of integers in the first sub-range.

EXAMPLE 26

The computer-implemented method of example 25, wherein the indication of the compressed representation is added to the compressed list information element using $\log_2[U_X-(L_X+N_X+2)]$ bits, where $U_X$ is the first middle integer, $L_X$ is the smallest integer, and $N_X$ is the number of integers in the first sub-range.

EXAMPLE 27

At least one machine readable medium comprising a plurality of instructions that in response to be executed by system at a host computing platform cause the system to carry out a method according to any one of examples 14 to 26.

EXAMPLE 28

An apparatus comprising means for performing the methods of any one of examples 14 to 26.

EXAMPLE 29

At least one machine readable medium comprising a plurality of instructions that in response to being executed on system cause the system to: receive a set of integers via an input stream; determine a range of the set of integers based on a smallest integer and a largest integer of the set of integers; generate a compressed list information element; add an indication of the range to the compressed list information element; recursively determine one or more sub-ranges of the set of integers; and add, for each of the one or more sub-ranges, an indication of the one or more sub-ranges to the compressed list information element.

EXAMPLE 30

The at least one machine readable medium of example 29, the instructions to further cause the system store the compressed list information element to a memory storage location.

EXAMPLE 31

The at least one machine readable medium of example 29, the instructions to further cause the system output the compressed list information element via an output stream.

EXAMPLE 32

The at least one machine readable medium of example 29, the instructions to further cause the system sort the set of integers based at least in part on a value of the integers.

EXAMPLE 33

The at least one machine readable medium of example 32, the instructions to further cause the system to: determine the smallest integer of the set of integers; and determine the largest integer of the set of integers.

EXAMPLE 34

The at least one machine readable medium of example 33, the instructions to further cause the system to: add an indication of the smallest integer to the compressed list information element; and add an indication of the largest integer to the compressed list information element.

EXAMPLE 35

The at least one machine readable medium of example 34, wherein the indication of the largest integer is based at least in part on $R_U=U-(L+n-1)$, where $R_U$ is a representation of the largest integer, U is the largest integer, L is the smallest integer, and n is the number of integers in the range.

EXAMPLE 36

The at least one machine readable medium of example 35, wherein the indication of the largest integer is added to the compressed list information element using $\log_2[U-(L+n)]$ bits, where U is the largest integer, L is the smallest integer, and n is the number of integers in the range.

EXAMPLE 37

The at least one machine readable medium of example 34, the instructions to further cause the system to: determine a first middle integer of the set of integers based at least in part on the range; determine a first sub-range of the set of integers based at least in part on the smallest integer and the first middle integer; and determine a second sub-range of the set of integers based at least in part on the first middle integer and the largest integer.

EXAMPLE 38

The at least one machine readable medium of example 37, the instructions to further cause the system to: determine a second middle integer of the set of integers based at least in part on either the first sub-range or the second sub-range; and determine a third sub-range of the set of integers based at least in part on the second middle integer and either the smallest integer or the largest integer.

EXAMPLE 39

The at least one machine readable medium of example 37, the instructions to further cause the system to: determine a compressed representation of the first middle integer based at least in part on the smallest integer and the largest integer; and add the compressed representation of the first middle integer to the compressed list information element.

EXAMPLE 40

The at least one machine readable medium of example 39, wherein the compressed representation is based at least in part on $R_{MX}=M_X-L_X-N_X+2$, where $R_{MX}$ is the compressed representation, $M_X$ is the middle integer, $L_X$ is the smallest integer, and $N_X$ is the number of integers in the first sub-range.

EXAMPLE 41

The at least one machine readable medium of example 40, wherein the indication of the compressed representation is added to the compressed list information element using $\log_2[U_X-(L_X+N_X+2)]$ bits, where $U_X$ is the first middle integer, LX is the smallest integer, and $N_X$ is the number of integers in the first sub-range.

EXAMPLE 42

A memory device comprising: a memory array; logic, at least a portion of which is implemented in hardware, the logic to: receive a set of integers, where each of the set of integers corresponds to a portion of the memory array; determine a range of the set of integers based on a largest integer and a smallest integer in the set of integers; generate a compressed list information element; add an indication of the range to the compressed list information element; recursively subdivide the range into one or more sub-ranges; and add, for each of the one or more sub-ranges, an indication of the one or more sub-ranges to the compressed list information element.

EXAMPLE 43

The memory device of example 42, the wherein the memory array is partitioned into memory blocks and the portions of the memory array correspond to bad memory blocks.

EXAMPLE 44

The memory device of example 42, the logic to store the compressed list information element to a portion of the memory array.

EXAMPLE 45

The memory device of example 42, the logic to sort the set of integers based at least in part on a value of the integers.

EXAMPLE 46

The memory device of example 45, the logic to: determine the smallest integer of the set of integers; and determine the largest integer of the set of integers.

EXAMPLE 47

The memory device of example 46, the logic to: add an indication of the smallest integer to the compressed list information element; and add an indication of the largest integer to the compressed list information element.

EXAMPLE 48

The memory device of example 47, the logic to add an indication of the largest integer to the compressed list information element based at least in part on $R_U=U-(L+n-1)$, where $R_U$ is a representation of the largest integer, U is the largest integer, L is the smallest integer, and n is the number of integers in the range.

EXAMPLE 49

The memory device of example 47, wherein the indication of the largest integer is added to the compressed list information element using $\log_2[U-(L+n)]$ bits, where U is the largest integer, L is the smallest integer, and n is the number of integers in the range.

EXAMPLE 50

The memory device of example 47, the logic to: determine a first middle integer of the set of integers based at least in part on the range; determine a first sub-range of the set of integers based at least in part on the smallest integer and the first middle integer; and determine a second sub-range of the set of integers based at least in part on the first middle integer and the largest integer.

EXAMPLE 51

The memory device of example 50, the logic to: determine a second middle integer of the set of integers based at least in part on either the first sub-range or the second sub-range; and determine a third sub-range of the set of integers based at least in part on the second middle integer and either the smallest integer or the largest integer.

EXAMPLE 52

The memory device of example 50, the logic to: determine a compressed representation of the first middle integer based at least in part on the smallest integer and the largest integer; add an indication of the compressed representation of the first middle integer to the compressed list information element.

EXAMPLE 53

The memory device of example 52, wherein the compressed representation is based at least in part on $R_{Mx}=M_x-L_x-N_x+2$, where $R_{Mx}$ is the compressed representation, $M_x$ is the middle integer, $L_x$ is the smallest integer, and $N_x$ is the number of integers in the first sub-range.

EXAMPLE 54

The memory device of example 53, wherein the indication of the compressed representation is added to the compressed list information element using $\log_2[U_x-(L_x+N_x+2)]$ bits, where $U_x$ is the first middle integer, LX is the smallest integer, and $N_x$ is the number of integers in the first sub-range.

EXAMPLE 55

The memory device of any one of examples 46 to 55, the memory array comprising: dynamic random access memory (DRAM), NAND memory, NOR memory, 3-Dimensional cross-point memory, ferroelectric memory, silicon-oxide-nitride-oxide-silicon (SONOS) memory, polymer memory, ferroelectric polymer memory, ferroelectric transistor random access memory (FeTRAM or FeRAM), nanowire, phase change memory, phase change memory with switch, magnetoresistive random access memory (MRAM), or spin transfer torque (STT) memory.

What is claimed is:

1. An apparatus comprising:
   a memory;
   an interface to receive a list information element via an input stream, the list information element to include indications of a plurality of integers; and
   logic, at least a portion of which is implemented in hardware comprising a circuit coupled with the memory, the logic to:
   determine a range of the plurality of integers;
   generate a compressed list information element;
   add an indication of the range to the compressed list information element;
   recursively subdivide the range into one or more sub-ranges;
   add, for each of the one or more sub-ranges, an indication of the one or more sub-ranges to the compressed list information element; and
   store the compressed list information element in the memory.

2. The apparatus of claim 1, wherein the memory comprises a computer-readable storage, the logic to store the compressed list information element to the computer-readable storage.

3. The apparatus of claim 1, the logic to send a control signal to the interface to cause the interface to output the compressed list information element via an output stream.

4. The apparatus of claim 1, the logic to sort the plurality of integers based at least in part on a value of the integers.

5. The apparatus of claim 4, the logic to:
determine a smallest integer of the plurality of integers;
determine a largest integer of the plurality of integers; and
determine the range of the plurality of integers based at least in part on the smallest integer and the largest integer.

6. The apparatus of claim 5, the logic to:
add an indication of the smallest integer to the compressed list information element; and
add an indication of the largest integer to the compressed list information element.

7. The apparatus of claim 6, the logic to add an indication of the largest integer to the compressed list information element based at least in part on $R_u=U-(L+n-1)$, where RU is a representation of the largest integer, U is the largest integer, L is the smallest integer, and n is a number of integers in the range.

8. The apparatus of claim 6, wherein the indication of the largest integer is added to the compressed list information element using $\log_2[U-(L+n)]$ bits, where U is the largest integer, L is the smallest integer, and n is a number of integers in the range.

9. The apparatus of claim 6, the logic to:
determine a first middle integer of the plurality of integers based at least in part on the range;
determine a first sub-range of the plurality of integers based at least in part on the smallest integer and the first middle integer; and
determine a second sub-range of the plurality of integers based at least in part on the first middle integer and the largest integer.

10. The apparatus of claim 9, the logic to:
determine a second middle integer of the plurality of integers based at least in part on either the first sub-range or the second sub-range; and
determine a third sub-range of the plurality of integers based at least in part on the second middle integer and either the smallest integer or the largest integer.

11. The apparatus of claim 9, the logic to:
determine a compressed representation of the first middle integer based at least in part on the smallest integer and the largest integer; and
add an indication of the compressed representation of the first middle integer to the compressed list information element.

12. The apparatus of claim 11, wherein the compressed representation is based at least in part on $R_{mx}=M_x-L_x-N_x+2$, where RMX is the compressed representation, MX is the middle integer, LX is the smallest integer, and NX is a number of integers in a first sub-range.

13. The apparatus of claim 12, wherein the indication of the compressed representation is added to the compressed list information element using $\log_2[U_x-(L_x+N_x+2)]$ bits, where UX is the first middle integer, LX is the smallest integer, and NX is the number of integers in the first sub-range.

14. A method comprising:
receiving, via a circuit coupled with memory, a list information element via an input stream, the list information element to include indications of a plurality of integers;
determining, via the circuit, a range of the plurality of integers;
generating, via the circuit, a compressed list information element;
adding, via the circuit, an indication of the range to the compressed list information element;
recursively determining, via the circuit, one or more sub-ranges of the plurality of integers;
adding, via the circuit, for each of the one or more sub-ranges, an indication of the one or more sub-ranges to the compressed list information element; and
storing, via the circuit, the compressed list information in memory.

15. The method of claim 14, comprising:
sorting the plurality of integers based at least in part on a value of the integers;
determining a smallest integer of the plurality of integers; and
determining a largest integer of the plurality of integers.

16. The method of claim 15, adding the indication of the range to the compressed list information element comprising:
adding an indication of the smallest integer to the compressed list information element; and
adding an indication of the largest integer to the compressed list information element.

17. The method of claim 16, wherein the indication of the largest integer is based at least in part on $R_u=U-(L+n-1)$, where RU is a representation of the largest integer, U is the largest integer, L is the smallest integer, and n is the number of integers in the range, and wherein the indication of the largest integer is added to the compressed list information element using $\log_2[U-(L+n)]$ bits, where U is the largest integer, L is the smallest integer, and n is a number of integers in the range.

18. The method of claim 17, recursively determining the one or more sub-ranges of the plurality of integers comprising:
determining a first middle integer of the plurality of integers based at least in part on the range;
determining a first sub-range of the plurality of integers based at least in part on the smallest integer and the first middle integer; and
determining a second sub-range of the plurality of integers based at least in part on the first middle integer and the largest integer.

19. The method of claim 18, adding an indication of the one or more sub-ranges to the compressed list information element comprising:
determining a compressed representation of the first middle integer based at least in part on the smallest integer and the largest integer; and
adding the compressed representation of the first middle integer to the compressed list information element.

20. At least one machine readable, non-transitory storage medium comprising a plurality of instructions that in response to being executed on system cause the system to:
receive a list information element via an input stream, the list information element to include indications of a plurality of integers;
determine a range of the plurality of integers;
generate a compressed list information element;
add an indication of the range to the compressed list information element;
recursively determine one or more sub-ranges of the plurality of integers; and add, for each of the one or more sub-ranges, an indication of the one or more sub-ranges to the compressed list information element.

21. The at least one machine readable, non-transitory storage medium of claim 20, the instructions to further cause the system to:
determine a smallest integer of the plurality of integers; and
determine a largest integer of the plurality of integers.

22. The at least one machine readable, non-transitory storage medium of claim 21, the instructions to further cause the system to:
determine a first middle integer of the plurality of integers based at least in part on the range;
determine a first sub-range of the plurality of integers based at least in part on the smallest integer and the first middle integer; and
determine a second sub-range of the plurality of integers based at least in part on the first middle integer and the largest integer.

23. The at least one machine readable, non-transitory storage medium of claim 22, the instructions to further cause the system to:
determine a compressed representation of the first middle integer based at least in part on the smallest integer and the largest integer; and
add the compressed representation of the first middle integer to the compressed list information element.

24. The at least one machine readable, non-transitory storage medium of claim 23, wherein the compressed representation is based at least in part on $R_{mx}=M_x-L_x-N_x+2$, where RMX is the compressed representation, MX is the middle integer, LX is the smallest integer, and NX is a number of integers in the first sub-range, and wherein the indication of the compressed representation is added to the compressed list information element using $\log_2[U_x-(L_x+N_x+2)]$ bits, where UX is the first middle integer, LX is the smallest integer, and NX is the number of integers in the first sub-range.

25. A memory device comprising:
a memory array; and
logic, at least a portion of which is implemented in hardware comprising a circuit, the logic to:
receive, via the circuit, a list information element, the list information element to include indication of a plurality of integers, where each of the plurality of integers corresponds to a portion of the memory array;
determine, via the circuit, a range of the plurality of integers;
generate, via the circuit, a compressed list information element;
add, via the circuit, an indication of the range to the compressed list information element;
recursively subdivide, via the circuit, the range into one or more sub-ranges; and
add, via the circuit, for each of the one or more sub-ranges, an indication of the one or more sub-ranges to the compressed list information element.

26. The memory device of claim 25, wherein the memory array is partitioned into memory blocks and the portions of the memory array correspond to bad memory blocks, the logic to store the compressed list information element to a portion of the memory array.

27. The memory device of claim 26, the logic to:
determine a smallest integer of the plurality of integers;
determine a largest integer of the plurality of integers;
add an indication of the smallest integer to the compressed list information element; and
add an indication of the largest integer to the compressed list information element.

28. The memory device of claim 27, the logic to add an indication of the largest integer to the compressed list information element based at least in part on $R_u=U-(L+n-1)$, where RU is a representation of the largest integer, U is the largest integer, L is the smallest integer, and n is the number of integers in the range, wherein the indication of the largest integer is added to the compressed list information element using $\log_2[U-(L+n)]$ bits, where U is the largest integer, L is the smallest integer, and n is a number of integers in the range.

29. The memory device of claim 28, the logic to:
determine a first middle integer of the plurality of integers based at least in part on the range;
determine a first sub-range of the plurality of integers based at least in part on the smallest integer and the first middle integer; and
determine a second sub-range of the plurality of integers based at least in part on the first middle integer and the largest integer.

30. The memory device of claim 29, the logic to:
determine a compressed representation of the first middle integer based at least in part on the smallest integer and the largest integer; and
add an indication of the compressed representation of the first middle integer to the compressed list information element,
wherein the compressed representation is based at least in part on $R_{Mx}=M_x-L_x-N_x+2$, where RMX is the compressed representation, MX is the middle integer, LX is the smallest integer, and NX is the number of integers in the first sub-range, and
wherein the indication of the compressed representation is added to the compressed list information element using $\log_2[U_x-(L_x+N_x+2)]$ bits, where UX is the first middle integer, LX is the smallest integer, and NX is a number of integers in the first sub-range.

31. The memory device of claim 30, the memory array comprising dynamic random access memory (DRAM), NAND memory, NOR memory, 3-Dimensional cross-point memory, ferroelectric memory, silicon-oxide-nitride-oxide-silicon (SONOS) memory, polymer memory, ferroelectric polymer memory, ferroelectric transistor random access memory (FeTRAM or FeRAM), nanowire, phase change memory, phase change memory with switch, magnetoresistive random access memory (MRAM), or spin transfer torque (STT) memory.

* * * * *